(12) United States Patent
Tanaka et al.

(10) Patent No.: US 10,432,115 B2
(45) Date of Patent: Oct. 1, 2019

(54) MOTOR DRIVING CONTROL APPARATUS

(71) Applicants: MICROSPACE CORPORATION, Tokyo (JP); TAIYO YUDEN CO., LTD., Tokyo (JP)

(72) Inventors: Masato Tanaka, Tokyo (JP); Hiromi Hagiwara, Tokyo (JP); Kazuo Asanuma, Tokyo (JP); Hirokazu Shirakawa, Tokyo (JP)

(73) Assignees: MICROSPACE CORPORATION, Tokyo (JP); TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/393,912

(22) Filed: Dec. 29, 2016

(65) Prior Publication Data

US 2017/0110994 A1   Apr. 20, 2017

Related U.S. Application Data

(63) Continuation of application No. PCT/JP2015/068761, filed on Jun. 30, 2015.

(30) Foreign Application Priority Data

Jun. 30, 2014   (JP) .................................. 2014-135464

(51) Int. Cl.
*H02P 27/04*   (2016.01)
*H02P 6/18*    (2016.01)
(Continued)

(52) U.S. Cl.
CPC ............... *H02P 6/10* (2013.01); *B60L 50/20* (2019.02); *B62M 6/45* (2013.01); *B62M 6/50* (2013.01);
(Continued)

(58) Field of Classification Search
CPC ............... H02P 6/16; H02P 25/04; H02P 5/74
See application file for complete search history.

(56) References Cited

U.S. PATENT DOCUMENTS 6,081,087 A   6/2000 Iijima et al.
6,400,107 B1  6/2002 Nakatani et al.
(Continued)

FOREIGN PATENT DOCUMENTS

JP   4-304191       10/1992
JP   11069861 A      3/1999
(Continued)

OTHER PUBLICATIONS

International Search Report dated Sep. 15, 2015 in corresponding International Application No. PCT/JP2015/068761.
(Continued)

*Primary Examiner* — Bickey Dhakal
*Assistant Examiner* — Charles S Laughlin
(74) *Attorney, Agent, or Firm* — Staas & Halsey LLP

(57) ABSTRACT

A motor driving control apparatus in embodiments includes: a first signal generator to generate a first signal representing any one rotation angle section of plural rotation angle sections according to a sensor signal that changes every predetermined rotation angle of a rotor; a measurement unit to measure a period of each of the rotation angle sections; a prediction unit to predict a period of a next rotation section based on one or plural measured rotation angle sections; a second signal generator to generate a second signal representing a relative rotation angle of the rotor in the next rotation angle section for each period obtained by dividing the predicted period by a predetermined number; and a third signal generator to generate a third signal corresponding to a rotation angle of the rotor based on the first and second signals.

9 Claims, 11 Drawing Sheets

(51) Int. Cl.
*H02M 7/48* (2007.01)
*H02P 6/10* (2006.01)
*H02P 6/16* (2016.01)
*B62M 6/50* (2010.01)
*B62M 6/75* (2010.01)
*B62M 6/90* (2010.01)
*H02P 27/08* (2006.01)
*B62M 6/45* (2010.01)
*G01R 23/00* (2006.01)
*H02P 6/15* (2016.01)
*B60L 50/20* (2019.01)

(52) U.S. Cl.
CPC ............... *B62M 6/75* (2013.01); *B62M 6/90* (2013.01); *G01R 23/00* (2013.01); *H02P 6/153* (2016.02); *H02P 6/16* (2013.01); *H02P 27/08* (2013.01); *B60L 2200/12* (2013.01); *B60L 2220/16* (2013.01); *B60L 2240/46* (2013.01); *B60Y 2200/13* (2013.01); *B60Y 2200/91* (2013.01); *B60Y 2400/602* (2013.01); *Y02T 10/642* (2013.01)

(56) References Cited

U.S. PATENT DOCUMENTS 6,512,343 B1 * 1/2003 Yasohara ............... H02P 6/085
318/400.01

2012/0241264 A1 9/2012 Hosaka et al.
2014/0354271 A1 * 12/2014 Kawase ............... G01D 5/2451
324/207.25

FOREIGN PATENT DOCUMENTS

| | | |
|---|---|---|
| JP | 11-215881 | 8/1999 |
| JP | 2001-128483 | 5/2001 |
| JP | 2001-245487 | 9/2001 |
| JP | 2002-199778 | 7/2002 |
| JP | 2003-111469 | 4/2003 |
| JP | 2004-282954 | 10/2004 |
| JP | 2005-51950 | 2/2005 |
| JP | 2005-160183 | 6/2005 |
| JP | 2009-141900 | 6/2009 |
| JP | 2011-176912 A | 9/2011 |
| WO | WO 2013/042437 A1 | 3/2013 |

OTHER PUBLICATIONS

International Search Report dated Sep. 29, 2015 in corresponding International Application No. PCT/JP2015/068762.
Office Action dated Mar. 12, 2018 in related U.S. Appl. No. 15/393,924.
Office Action dated Jul. 2, 2019 in related Japanese Patent Application No. 2016-531375 (3 pages) (5 pages English Translation).

* cited by examiner

MOTOR DRIVING CONTROL APPARATUS

CROSS-REFERENCE TO RELATED APPLICATIONS

This application is a continuing application, filed under 35 U.S.C. section 111(a), of International Application PCT/JP2015/068761, which was filed on Jun. 30, 2015 and claimed the benefit of priority of the prior Japanese Patent Application No. 2014-135464 filed on Jun. 30, 2014, the entire contents of which are incorporated herein by reference.

TECHNICAL FIELD

This invention relates to a motor driving control apparatus for controlling driving of a motor, more particularly to a motor driving control apparatus for driving a brushless motor by a sine wave.

BACKGROUND TECHNOLOGY

As driving methods for driving a brushless motor, a driving method by intermittent turn-on and a driving method by continuous turn-on are known. In the driving method by continuous turn-on, the driving control is performed by a driving signal, which has a continuous waveform such as a sine wave, therefore, torque fluctuation is less than that of the driving method by intermittent turn-on, and as a result, there is a merit that it is possible to suppress occurrence of vibration and/or noises. In addition, when a driving voltage, which has a sine waveform, is used, it is possible to obtain high efficiency by performing a proper lead angle control to synchronize a phase of the induced voltage (counter electromotive force) with a phase of a phase current, because the waveforms of the induced voltage and the phase current become analogous.

In order to make the waveforms of the induced voltage and the phase current analogous in the driving method by continuous turn-on, it is necessary to correctly measure or estimate a position of the rotor in the motor and generate a driving signal according to the position of the rotor. It is possible to accurately detect the position of the rotor by using a rotary encoder, for example.

However, the rotary encoder is expensive, therefore, it is desirable that it is possible to accurately grasp the position of the rotor without using the rotary encoder. One of proposals for accurately grasping the position of the rotor without using the rotary encoder is a method for grasping the rough position of the rotor based on a sensor signal outputted from a hall effect Integrated Circuit to estimate a precise position between hall effect ICs based on the rotation speed of the rotor or the like (See Japanese Laid-open patent application Publication 2001-128483 (Patent Document 1).).

In addition, as described in Japanese Laid-open Patent Application Publication 2005-51950 (Patent Document 2), a method is also known, in which the waveform of the phase current is monitored in real time by using a current sensor, and a voltage command to a motor driving circuit (inverter) is generated based on the monitored waveform of the phase current. However, the current sensor is also expensive, therefore, it is desirable that the sine-wave driving control of the brushless motor is realized also without using the current sensor.

PRIOR TECHNICAL DOCUMENTS

Patent Document 1: Japanese Laid-open Patent Application Publication 2001-128483
Patent Document 2: Japanese Laid-open Patent Application Publication 2005-51950

In the aforementioned Patent Document 1, it is pointed out that, when the difference between the estimated value of the rotation electrical angle of the rotor and the actual rotation angle of the rotor becomes greater, for example, at rapid acceleration or deceleration, bad influences appear such as deterioration of the power factor, deterioration of the power performance and deterioration of the operational sense. Then, in order to cope with such problems, it is proposed to reduce the difference between the estimated value of the rotation angle and the actual rotation angle by increasing the estimated value of the rotation angle at the acceleration of the rotor and decreasing the estimated value of the rotation angle at the deceleration of the rotor. However, in the method described in the Patent Document 1, because the current command value is generated, it is necessary to measure the actual current that flows the coil of each phase by the current sensor, therefore, it is impossible to omit the current sensor.

In the aforementioned Patent Document 2, it is proposed to reduce the number of current sensors in the motor driving system, however, two current sensors are reduced to one current sensor. Namely, the output from the current sensor is still required for the motor driving control. In addition, in the Patent Document 1, because the coils are delta-connected, the current that does not contribute to the torque of the motor flows in the coils, when the waveform of the induced voltage has harmonic distortion. Accordingly, the energy loss easily occurs.

An object of this invention is to solve at least one of the aforementioned problems. Specifically, one object of this invention is to provide a motor driving control apparatus that can perform sine-wave driving of the brushless motor without both of the expensive rotary encoder and current sensor. In addition, another object of this invention is to estimate the rotation electric angle of the rotor with high accuracy without both of the expensive rotary encoder and current sensor, accordingly to suppress defects such as vibration and/or noises occurred when the estimated value of the rotation electric angle of the rotor deviates from the actual rotation angle. Still another object of this invention is to provide a motor driving control apparatus (that is applicable to either a star connection or delta connection, for example) that can be applicable independently on the type of the coil connection. Still another object of this invention is to provide a motor driving control apparatus that can perform driving by intermittent turn-on by using a continuous phase signal, which corresponds to the rotation electric angle of the rotor. Objects of this invention, which are other than those, are clarified through the description of the entire Specification.

SUMMARY OF THE INVENTION

A motor driving control apparatus of embodiments includes: a first signal generator configured to generate a first signal representing any one rotation angle section of plural rotation angle sections according to a sensor signal that changes every predetermined rotation angle of a rotor, wherein each of the plural rotation angle sections has the predetermined rotation angle; a measurement unit configured to measure a period of each of the plural rotation angle sections according to the sensor signal; a prediction unit configured to predict a period of a next rotation section based on one or plural rotation angle sections measured by the measurement unit; a second signal generator configured to generate a second signal representing a relative rotation angle of the rotor in the next rotation angle section for each period that is obtained by dividing the predicted period by a predetermined number; and a third signal generator configured to generate a third signal corresponding to a rotation angle of the rotor based on the first and second signals.

DESCRIPTION OF EMBODIMENTS

Figure 1:
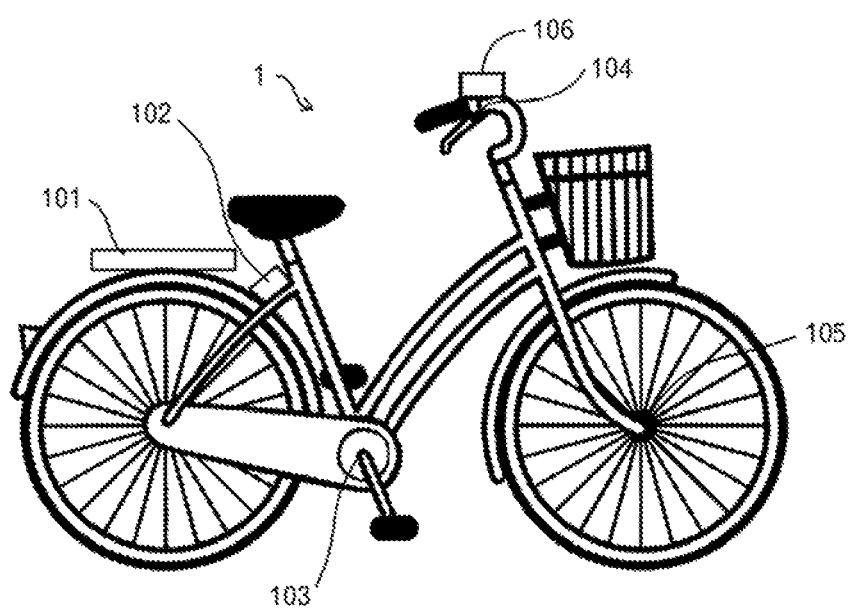
FIG. 1 is a diagram roughly depicting a motor-assisted bicycle relating to one embodiment of this invention.

Various embodiments of this invention will be explained properly referring to drawings, thereinafter. In addition, the same reference symbol is attached to the same element in the drawings.

FIG. 1 roughly depicts a motor-assisted bicycle to which a motor driving control apparatus relating to one embodiment is applicable. The motor-assisted bicycle is one mere application example to which the motor driving control apparatus relating to this invention can be applied, and the motor driving control apparatus relating to this invention can be used for driving control of the brushless motor in various purposes.

As depicted in FIG. 1, the motor-assisted bicycle 1 is a typical rear-wheel driving type bike in which the crankshaft is connected with the rear wheel through the chain, and has a secondary battery 101, a motor driving control apparatus 102, a torque sensor 103, a brake sensor 104, a motor 105 and a control panel 106, for example.

As for the secondary battery 101, various secondary batteries can be used such as a lithium ion secondary battery, a lithium ion polymer secondary battery, or a nickel-metal hydride chargeable battery. In one embodiment of this invention, the secondary battery 101 is a lithium ion secondary battery with a maximum supply voltage of 24 V (when fully charged).

The torque sensor 103 is provided on a wheel, which is installed in the crankshaft. The torque sensor 103 detects a pedal force or pressure, and outputs this detection result to the motor driving control apparatus 102.

The brake sensor 104 is composed of a magnet (not depicted) and a well-known reed switch (not depicted). The magnet is fixed to a brake wire (not depicted) coupled with a brake lever in a case in which the brake lever is fixed and through which the brake wire passes. The brake lever is configured so as to cause the reed switch to be an ON state when the brake lever is grasped by the hand. In addition, the reed switch is fixed in the case. An electrical connection signal of this reed switch is transmitted to the motor driving control apparatus 102.

The motor 105 is, for example, a well-known three-phase direct current brushless motor. A method for connecting coils of the motor 105 is arbitrary, and may be the star connection or delta-connection, for example. The motor 105 is mounted on a front wheel of the motor-assisted bicycle 1, for example. The motor 105 rotates the front wheel, and is connected to the front wheel so that an internal rotor rotates according to the rotation of the front wheel. In addition, the motor 105 has plural (typically, three) hall effect ICs (not depicted) in order to detect positions (i.e. phase of the rotor) of a magnetic pole, which the internal rotor has. Signals (i.e. hall output signals) that represent a phase of the rotor, which is detected by the hall effect IC, are outputted to the motor driving control apparatus 102. When the number of hall effect ICs is 3, these three hall effect ICs are arranged in the motor 105 at regular intervals of 120 degrees, for example, along a circumference direction. When the rotor of the motor 105 rotates, the hall effect IC detects a magnetic field caused by a permanent magnet of the rotor, and outputs the hall output signals Hu, Hv and Hw (See (a) to (c) in FIG. 6) according to the detected magnetic field intensity. As one example, the hall effect ICs mounted in the motor 105 are arranged so as to output the hall output signals Hu, Hv and Hw whose electric angles are delayed by 30 degrees against the counter electromotive forces of the corresponding U phase, V phase and W phase.

Figure 2:
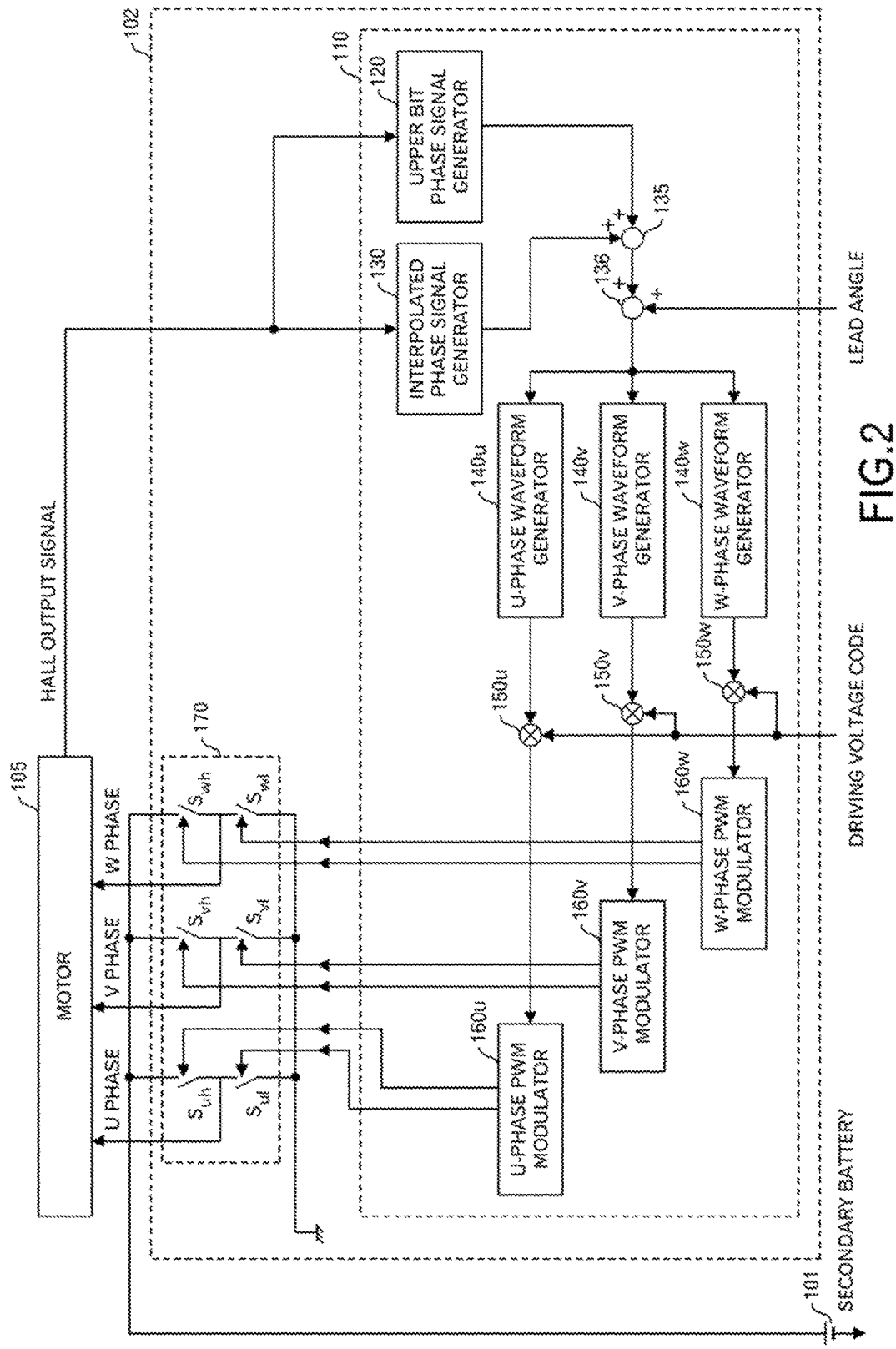
FIG. 2 is a functional block diagram of a motor driving control apparatus relating to one embodiment of this invention.

FIG. 2 roughly illustrates the motor driving control apparatus 102 that controls driving of the motor 105. As described later in detail, the motor driving control apparatus 102 relating to one embodiment of this invention forms a continuous driving waveform that corresponds to the rotation electric angle of the rotor in the motor 105 based on the hall output signals (sensor signals) from the cheep hall effect ICs without using any output signals from the current sensor and the rotary encoder.

As depicted in FIG. 2, the motor driving control apparatus 102 has a driving controller 110 and an inverter circuit 170 that is composed of an FET (Field Effect Transistor) bridge. The inverter circuit 170 includes a high side FET ($S_{uh}$) and a low side FET ($S_{ul}$) to perform switching of the U phase of the 3-phase brushless motor 105, a high side FET ($S_{vh}$) and a low side FET ($S_{vl}$) to perform switching of the V phase in the motor 105, and a high side FET ($S_{wh}$) and a low side FET ($S_{wl}$) to perform switching of the W phase in the motor 105, and is configured by connecting the respective FETs so as to make a three-phase bridge. An output terminal for each phase in the inverter circuit 170 is electrically connected with the coil of each phase in the motor 105. Each FET provided in the inverter circuit 170 is switched by the driving signal outputted from the driving controller 110. Thus, in the inverter circuit 170, ON and OFF of the switching elements (respective FETs) are controlled based on the driving signals outputted from the driving controller 110, and the voltage supplied from the secondary battery 101 is converted by the ON and OFF control of these switching elements to generate a driving voltage for each phase. The generated driving voltage for each phase is supplied to the coil for each phase in the motor 105.

As illustrated in the drawing, the driving controller 110 relating to one embodiment of this invention has an upper bit phase signal generator 120, an interpolated phase signal generator 130, an upper&lower-bits adder 135, a lead-angle value adder 136, a U-phase waveform generator 140u, a V-phase waveform generator 140v, a W-phase waveform generator 140w, a multiplier 150u, a multiplier 150v, a multiplier 150w, a U-phase PWM modulator 160u, a V-phase PWM modulator 160v and a W-phase PWM modulator 160w. In addition, the driving controller 110 may have a memory, which is not depicted and stores various data used in the computation and/or data in progress. This memory may be provided separately from the driving controller 110.

The upper bit phase signal generator 120 reads the hall output signals Hu, Hv and Hw from the hall effect ICs provided in the motor 105, calculates a range of the electrical angle, which corresponds to the rotation electrical angle of the rotor according to signal levels of these hall output signals, and encodes the electrical angle into a upper bit phase signal of 3 bits. For example, when the signal levels of the hall output signals Hu, Hv and Hw are respectively detected as illustrated in (a) to (c) in FIG. 6, the rotation electrical angle of the rotor is encoded into a 3-bit code, which is one of "0" to "5" according to the signal levels of the hall output signals Hu, Hv and Hw as illustrated in (e) in FIG. 6. In other words, by incrementing the value each time when the rotation angle increases 60 degrees, the rotation electrical angle of the rotor can be encoded to the 3-bit code, for example, when the hall output signal Hu, Hv and Hw respectively correspond to H, L and H, "0" (the electrical angle 0 degree to 60 degree) is obtained, when Hu, Hv and Hw respectively correspond to H, L and L, "1" (the electrical angle 60 degrees to 120 degrees) is obtained, . . . and when Hu, Hv and Hw respectively correspond to L, L and H, "5" (the electrical angle 300 degrees to 360 degrees) is obtained. The number of bits required for encoding the rotation angle (i.e. the number of bits for the upper bit phase signal) may be greater or less than three, depending on the number of hall effect ICs.

Figure 6:
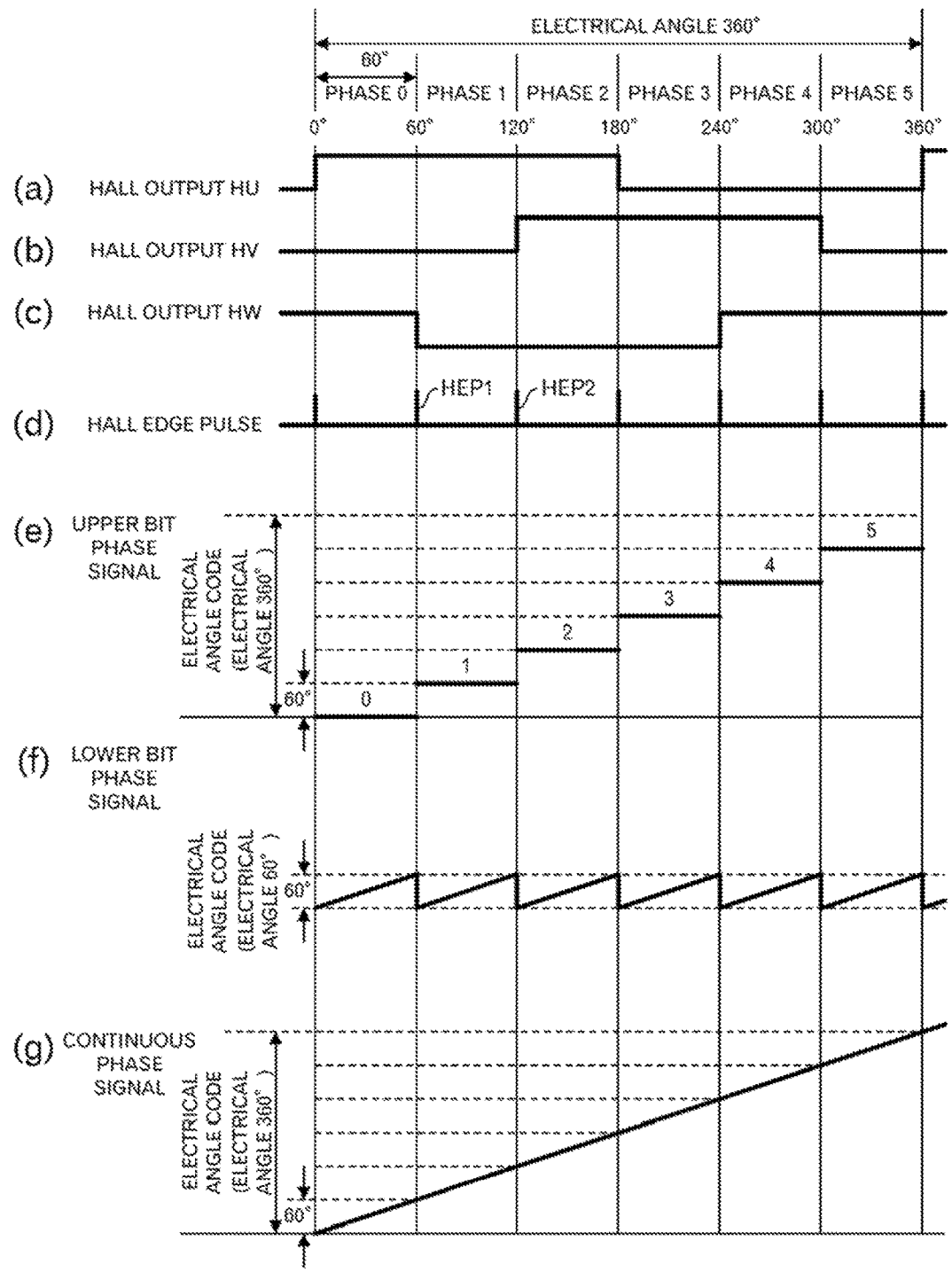
FIG. 6 is a timing chart of an upper bit phase signal, an interpolated phase signal and a continuous phase signal in one embodiment of this invention.

As illustrated in (f) in FIG. 6, the interpolated phase signal generator 130 in one embodiment of this invention generates an interpolated phase signal (also called "a lower bit phase signal"), which represents the rotation electrical angle of the rotor in the motor 105 with high resolution based on the hall output signal Hu, Hv and Hw. When the upper bit phase signal represents the rotation angle for each 60 degrees of the electrical angle, the interpolated phase signal represents a rotation angle, which is much detailed than 60 degrees of the electrical angle. The detail of the interpolated phase signal generator 130 will be explained later.

The upper&lower-bits adder 135 adds the upper bit phase signal from the upper bit phase signal generator 120 as a first signal generator and the interpolated phase signal as a second signal generated from the interpolated phase signal generator 130 to generate a continuous phase signal. The upper&lower-bits adder 135 as a third signal generator generates the continuous phase signal by adding the upper bit phase signal from the upper bit phase signal generator 120 as data for upper digits of the counter and the interpolated phase signal as the second signal generated from the interpolated phase signal generator 130 as data for lower digits of the counter. The continuous phase signal is depicted as an example in (g) in FIG. 6.

The lead-angle value adder 136 in one embodiment of this invention adds the lead angle value to the continuous phase signal from the upper&lower-bits adder 135.

The U-phase waveform generator 140u in one embodiment of this invention generates a driving reference waveform signal for the U phase based on the continuous phase signal, to which the lead angle value is added in the lead-angle value adder 136. Similarly, the V-phase waveform generator 140v and W-phase waveform generator 140w also generate a driving reference waveform signal for the V phase and a driving reference waveform signal for the W phase based on the continuous phase signal, to which the lead angle value is added in the lead-angle value adder 136, respectively. The driving reference waveform signal for each phase is illustrated as an example in (g) to (i) in FIG. 8. A specific method for forming the driving reference waveform signals will be explained later.

The multipliers 150u, 150v and 150w in one embodiment of this invention respectively multiply a predetermined driving voltage code to the driving reference waveform signals from the corresponding U-phase waveform generators 140u, 140v and 140w to generate PWM codes corresponding to duty ratios for the PWM modulation.

The U-phase PWM modulator 160u in one embodiment of this invention generates switching signals for the U phase based on the PWM code from the multiplier 150u, and outputs the generated switching signals to the FET ($S_{uh}$) and FET ($S_{ul}$). Similarly, the V-phase PWM modulator 160v generates switching signals for the V phase based on the PWM code from the multiplier 150v, and outputs the generated switching signals to the FET ($S_{vh}$) and FET ($S_{vl}$). The W-phase PWM modulator 160w generates switching signals for the W phase based on the PWM code from the multiplier 150w, and outputs the generated switching signals to the FET ($S_{wh}$) and FET ($S_{wl}$). Thus, the U-phase PWM modulator 160u, V-phase PWM modulator 160v and W-phase PWM modulator 160w control ON and OFF of the respective switching elements (FETs) in the inverter circuit 170 based on the PWM codes from the corresponding multipliers 150u, 150v and 150w. As described above, by controlling ON and OFF of the switching elements, the driving voltage of each phase is generated and the generated driving voltage is supplied to the coil of each phase in the motor 105.

Figure 3:
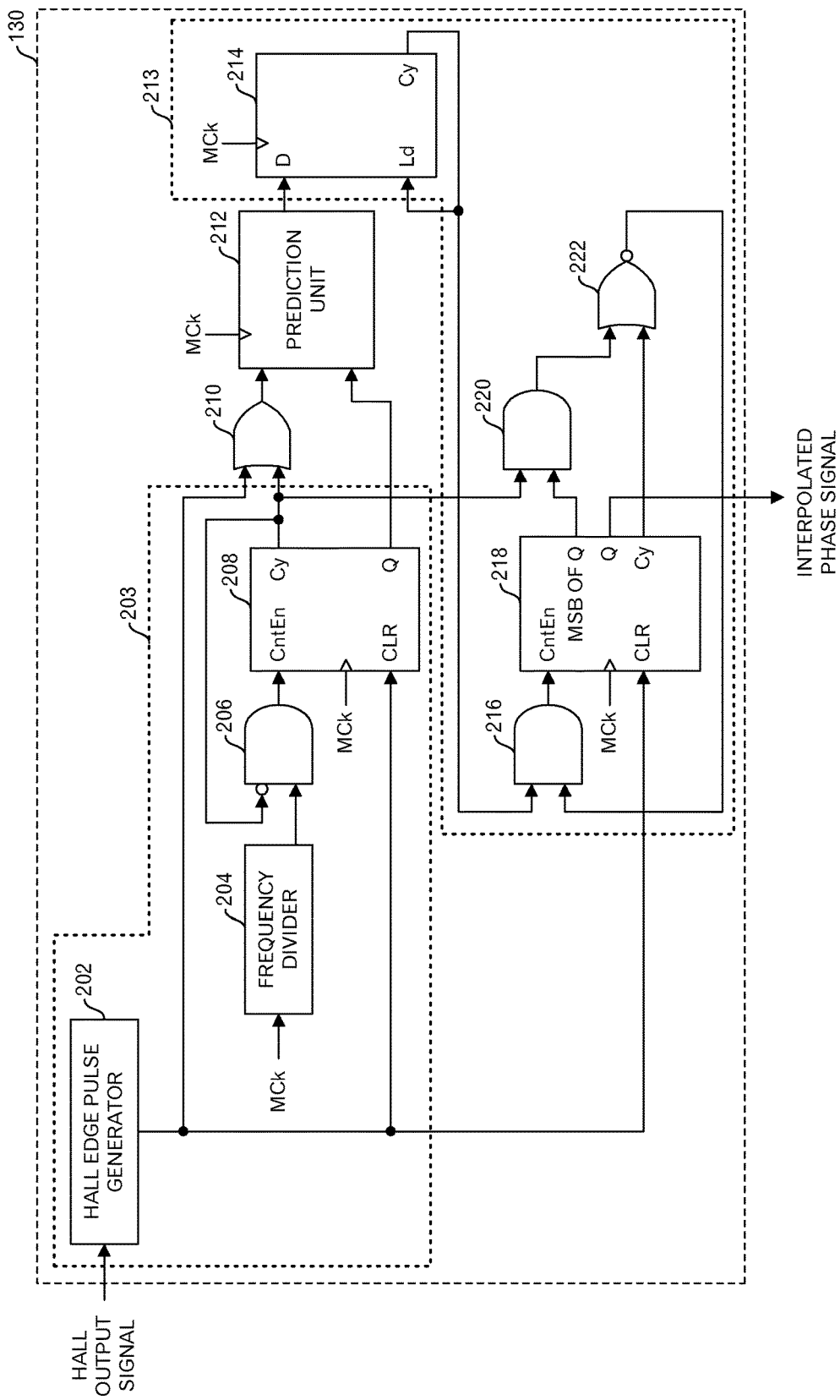
FIG. 3 is a block diagram depicting functions of an interpolated phase signal generator relating to one embodiment of this invention.

Next, by referring to FIG. 3, the interpolated phase signal generator 130 will further be explained. As illustrated in FIG. 3, the interpolated phase signal generator 130 relating to one embodiment of this invention has, as a measurement unit 203, a hall edge pulse generator 202, a frequency divider 204, an AND gate 206, and a counter 208; an OR gate 210; a prediction unit 212; and, as a second signal generator 213, a down counter 214, an AND gate 216, a counter 218, an AND gate 220 and a NOR gate 222.

The hall edge pulse generator 202 generates hall edge pulses (may be simply called "edge pulse"), which have a pulse width of a reference clock, each time when any one of the hall output signals Hu, Hv and Hw rises or falls, and outputs the generated hall edge pulses to the counter 208, OR gate 210 and counter 218. As illustrated in (d) in FIG. 6, the hall edge pulse is a pulse signal, which is generated at timings respectively corresponding to the rising edge and falling edge of the hall output signals Hu, Hv and Hw. For convenience sake, in this Specification, in order to distinguish the repeatedly generated hall edge pulses, when a hall edge pulse is outputted from the hall edge pulse generator 202, that hall edge pulse may be called as "this" or "present" edge pulse, and edge pulses, which was previously generated, may be called as "past" edge pulse. Especially, the edge pulse, which was generated immediately before "this" edge pulse, may be called as "last" edge pulse, and the edge pulse, which will be generated immediately after "this" edge pulse, may be called as "next" edge pulse.

The frequency divider 204 generates a divided clock signal by dividing, in frequency, the reference clock by a predetermined frequency division ratio, and outputs the generated divided clock signal to the counter 208 through the AND gate 206. The frequency division ratio may be 256, for example, and the frequency division ratio, which is applicable to this invention, is not limited to this value.

The counter 208 counts up the reference clock using, as an enable signal, the divided clock signal inputted through the AND gate 206 from the frequency divider 204. In addition, the counter 208 is configured to clear the counter value to set "0", when the edge pulse is inputted. Thus, the counter 208 can measure a time interval between outputs of the edge pulses.

An output from the OR gate 210 is inputted into the prediction unit 212 as a read enable signal. When the read enable signal is inputted into the prediction unit 212 from the OR gate 210, the count value (Q) of the counter 208 is read into the prediction unit 212.

The carry signal from the counter 208 and the edge pulse from the hall edge pulse generator 202 are inputted to the OR gate 210. Therefore, the read enable signal is inputted to the prediction unit 212 at an output timing of the edge pulse or at a timing when the counter 208 has fully counted. Therefore, when the rotation speed of the motor 105 is high, a next edge pulse is outputted before the counter 208 fully counts, therefore, the count value of the counter 208 is read into the prediction unit 212 at a timing when the next edge pulse is outputted from the hall edge pulse generator 202. On the other hand, when the rotation speed of the motor 105 is low, the counter 208 fully counts before the output timing of the next edge pulse, therefore, the count value of the counter 208 is read into the prediction unit 212 at a timing when the counter 208 has fully counted. Thus, in this Specification, a state where the motor 105 rotates at low speed, thereby, the counter 208 has fully counted, may be said as the motor 105 being in "a low-speed rotation state". According to the aforementioned explanation, when the motor 105 is not in the low-speed rotation state and the count value of the counter 208 is read in response to the edge pulse, the count value represents a time interval from the clearing of the counter 208 by the last edge pulse to the output of the present edge pulse.

Moreover, the carry signal that is outputted when the counter 208 has fully counted is inputted into the AND gate 206 after the inversion thereof. Thus, by inputting the carry signal to the AND gate 206 after the inversion thereof, the enable signal from the AND gate 206 is stopped from the full count of the counter 208 to the clearing by the edge pulse, and the counter 208 stops an operation of the counting-up while keeping the saturation state in which the counter 208 has fully counted. As described above, when the edge pulse is inputted into the counter 208, "0" is set to the counter 208. Because the output of the carry signal is stopped at that time, the counter 208 restarts the operation of the counting-up.

The prediction unit 212 determines a predicted value of the time interval from the present edge pulse to the next edge pulse based on the count value that is inputted from the counter 208 and represents the time interval from the last edge pulse to the present edge pulse. When the determination of this predicted value is explained by using (d) in FIG. 6 as an example, the hall edge pulse HEP1 is outputted at a boundary timing between phase 0 and phase 1 (the electrical angle 60 degrees), and when the count value is outputted to the prediction unit 212 from the counter 208 in response to the hall edge pulse HEP1, the predicted value of the time interval between the present hall edge pulse HEP1 and the next hall edge pulse HEP2 (the hall edge pulse outputted at a boundary timing between phase 1 and phase 2) is determined.

The predicted value of the time interval from the present edge pulse to the next edge pulse may be determined by various methods. The simplest method is a method in which the measured time interval from the last edge pulse to the present edge pulse is used as the predicted value of the time interval to the next edge pulse as it is. When the rotation speed of the motor is stable, an almost accurate predicted value can be obtained by this prediction method. In addition, it is possible to determine the predicted value since the second edge pulse has been outputted. In such a case, the prediction unit 212 has a flip flop to hold the time interval from the last edge pulse to the present edge pulse, and outputs the held time interval as the predicted value.

Figure 5:
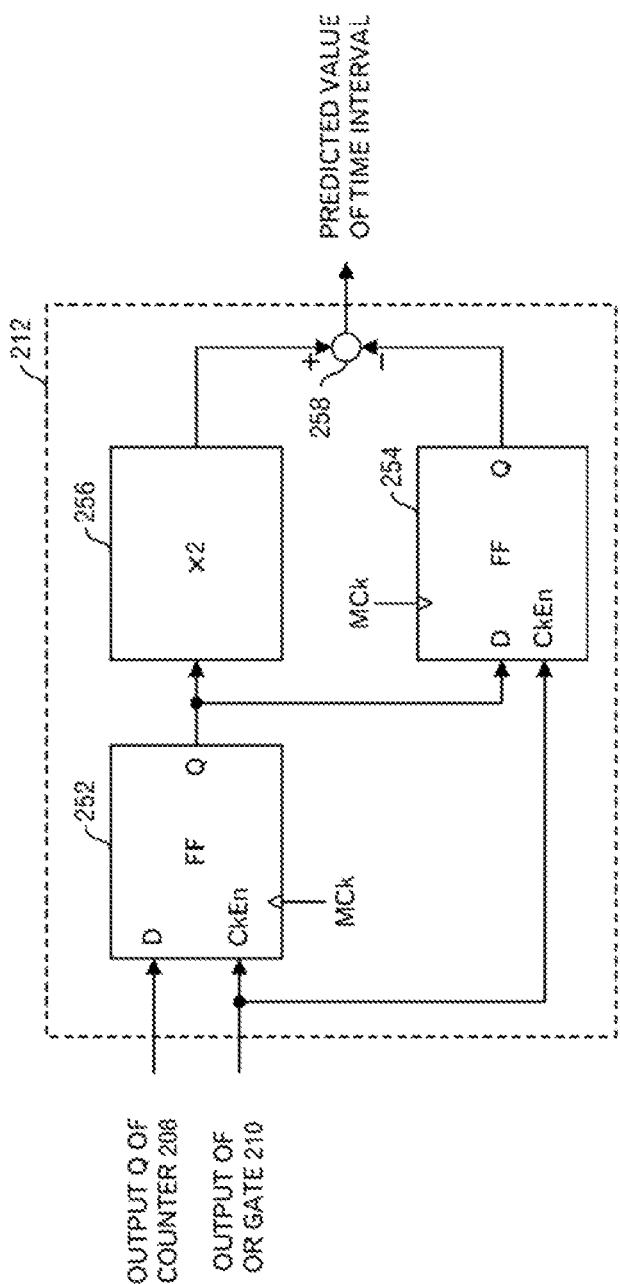
FIG. 5 is a block diagram depicting functions of a prediction unit relating to one embodiment of this invention.

Another example of the prediction unit 212 will be explained by referring to FIG. 5. FIG. 5 is a block diagram depicting functions of the prediction unit 212 relating to one embodiment of this invention. As depicted in the drawing, the prediction unit 212 relating to one embodiment of this invention has a flip flop 252, a flip flop 254, a multiplier 256 and an adder 258.

The flip flop 252 holds a value representing the time interval from the last edge pulse to the present edge pulse, and the flip flop 254 holds a value representing the time interval from the edge pulse before the last edge pulse to the last edge pulse. When the next edge pulse is outputted from the hall edge pulse generator 202, the flip flop 252 outputs the held value (the time interval from the last edge pulse to the present edge pulse) to the flip flop 254 and the multiplier 256, and newly holds a new count value inputted from the counter 208 (the time interval from the present edge pulse to the next edge pulse). When the next edge pulse is outputted from the hall edge pulse generator 202, the flip flop 254 outputs the held last count value (which is the last count value outputted from the counter 208 immediately before the present count value, and the time interval from the edge pulse before the last edge pulse to the last edge pulse) to the adder 258. The multiplier 256 doubles the present count value outputted from the flip flop 252, and outputs the doubled present count value to the adder 258. The adder 258 subtracts the input value from the flip flop 254 from the input value from the multiplier 256, and outputs the subtraction result as the predicted value of the time interval up to the next edge pulse. The outputted predicted value of the time interval up to the next edge pulse is inputted to the down counter 214. Thus, the prediction unit 212 can predict the time interval from the output timing of the latest outputted (i.e. present) edge pulse to the output timing of the future (especially, next) edge pulse, based on the measured values of the output intervals of the edge pulses, which were outputted past.

In response to its own borrow signal (output of the Cy terminal in FIG. 3), the down counter 214 loads the predicted value of the time interval up to the next edge pulse from the prediction unit 212, sets this predicted value, and performs an operation of the counting-down from the set value in response to the reference clock. When the underflow of the down counter 214 occurs by this operation of the counting-down, the aforementioned borrow signal is outputted, and the down counter 214 loads a next predicted value.

The borrow signal from the down counter 214 is inputted as an enable signal to the counter 218 through the AND gate 216. The counter 218 uses the borrow signal from the down counter 214 as the enable signal to perform an operation of the counting-up in response to the reference clock, and outputs the count value as the interpolated phase signal. In addition, the counter 218 is configured to be cleared in response to the edge pulse.

The down counter 214 sets the count value (the time interval of the edge pulses) counted by the counter 208, which uses, as the enable signal, the divided clock signal obtained by dividing, in frequency, the reference clock by the predetermined frequency division ratio, and down-counts from the set count value in response to the reference clock. Therefore, the frequency at which the down counter 214 outputs the borrow signal, in other words, the frequency of the enable signal for the counter 218 is a N-fold (N is the frequency division ratio) frequency of the hall edge frequency at which the edge pulses are outputted. For example, when the frequency divider 204 divides, in frequency, the reference clock by 256, the frequency of the enable signal for the counter 218 is a 256-fold frequency of the hall edge frequency. Because the counter 218 performs the counting operation of the reference clock by using the enable signal, which has a N-fold (N is the frequency division ratio) frequency of the hall edge frequency, the interpolated phase signal outputted as the count value of the counter 218 is a signal, which has a N-fold (N is the frequency division ratio) frequency of the edge pulse frequency.

Because the carry signal, which is outputted when an overflow occurs in the counter 218, is inputted into the AND gate 216 through the NOR gate 222, the counter 218 stops the operation of the counting-up while keeping the saturation state caused by the full count of the counter 218, after the counter 218 has fully counted. The counter 218 stops the operation of the counting-up and the saturation state is kept, until the next edge pulse is inputted from the hall edge pulse generator 202.

Figure 9:
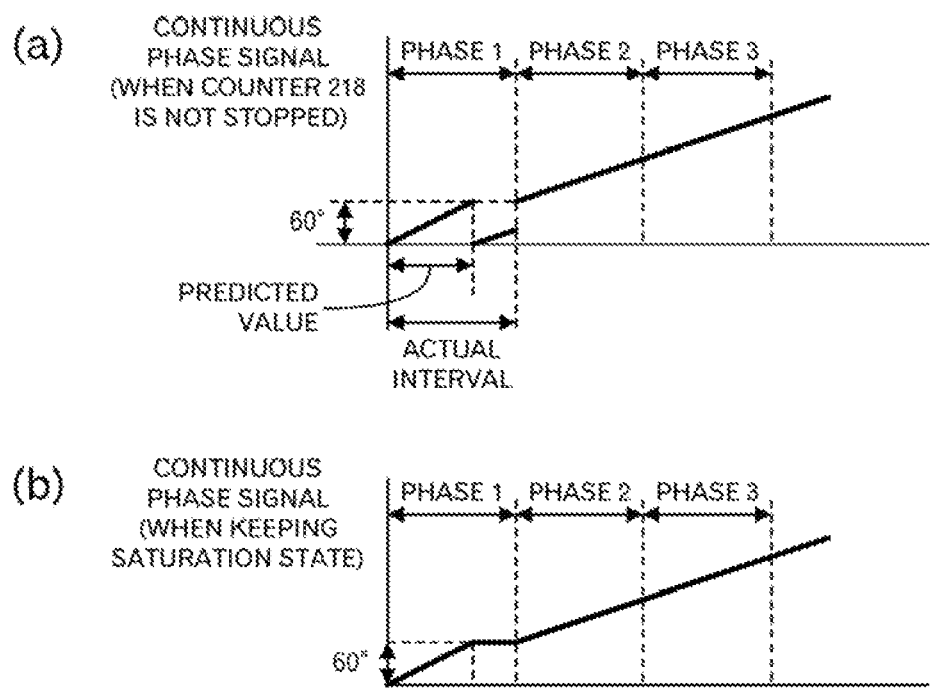
FIG. 9 is a diagram to explain the continuous phase signal that is generated when a predicted value of a time interval until a next edge is outputted is longer than a time interval until the next edge is actually detected, in one embodiment of this invention.

In case where the actual time interval is longer than the predicted value of the time interval up to the next edge pulse, which was outputted by the prediction unit 212, if the enable signal is continuously inputted into the counter 218 after the full count of the counter 218, the interpolated phase signal discontinuously changes because the overflow occurs in the counter 218 after the full count of the counter 218 and the count value returns to zero. Accordingly, a discontinuous change also occurs in the driving reference waveform, which is generated later, therefore, the large vibration and/or noises are caused. For example, when the count value of the counter 218 returns to zero after the full count of the counter 218, the discontinuous change of the interpolated phase signal, which occurs at the overflow of the counter 218 in phase 1, also causes the discontinuous change of the continuous phase signal, as illustrated (a) in FIG. 9. In contrast with this, by keeping the saturation state at which the counter 218 fully counted, the full count value is kept in the interpolated phase signal. Therefore, as illustrated in (b) in FIG. 9, it is possible not to cause the discontinuous section of the continuous phase signal.

Figure 10:
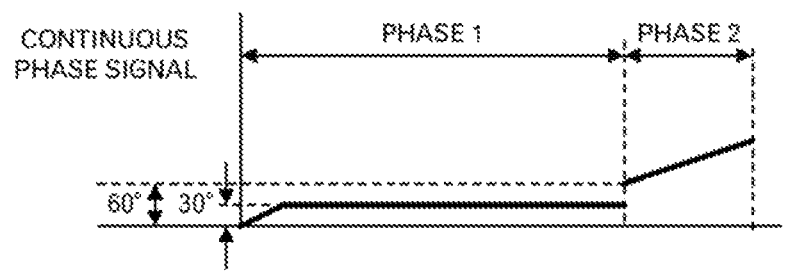
FIG. 10 is a diagram to explain the continuous phase signal that is generated when the motor rotates at low speed, in one embodiment of this invention.

Moreover, the most significant bit MSB of the count value is outputted to the AND gate 220 from the counter 218. The AND gate 220 generates a logical product of the most significant bit MSB from the counter 218 and the carry output from the counter 208, and outputs the generated logical product to the AND gate 216 through the NOR gate 222. Accordingly, in the low rotation state of the motor 105 in which the carry output is outputted from the counter 208, the supply of the enable signal to the counter 218 is stopped when the counter 218 counted by a half of the full count (when the most significant bit becomes "1"), therefore, the counter 218 stops the operation of the counting-up while keeping the output of the half of the full count. In the low rotation state of the motor 105, until the next edge pulse is outputted, it becomes very difficult to predict of the rotation electrical angle of the rotor, and it is unknown to determine what angle it is from 0 degree to 60 degrees. In this low rotation state of the motor 105, by stopping the operation of the counting-up of the counter 218 at the half of the full count, it is possible to suppress the error between the predicted position and the actual position of the rotation electrical angle of the rotor within plus or minus 30 degrees. For example, in case where the period of the phase 1 is extremely long, by stopping the operation of the counting-up when the counter 218 counts up to the half of the full count in this phase 1, in other words, up to a value equivalent to 30 degrees of the rotation electrical angle of the rotor, the continuous phase signal as illustrated in FIG. 10 is generated to suppress the error with the actual rotation electrical angle of the rotor within plus or minus 30 degrees. If the counting-up were performed up to the full count of the counter 218, the error, which is near 60 degrees at most, would occur in case where the rotation electrical angle of the rotor stays long time almost at 0 degree of the electrical angle. As described above, by stopping the operation of the counting of the counter 218 at the half of the full count, it is possible to reduce the error of the rotation electrical angle of the rotor.

As described above, by the interpolated phase signal generator 130, which is configured as illustrated in FIG. 3, it is possible to generate the interpolated phase signal that has the N-fold (N is the frequency division ratio) resolution capability compared with the electrical angle corresponding to the time interval of the edge pulses. In addition, the counter 218 that outputs the interpolated phase signal as the count value is configured to stop the operation of the counting-up while keeping the saturation state in which the counter 218 fully counted, therefore, even when the predicted time up to the next edge pulse is too short, it is possible to prevent the continuous phase signal (or the driving reference waveform signal) from being discontinuous. Moreover, in the low rotation state of the motor 105, because the operation of the counting of the counter 218 is stopped at the half of the full count, it is possible to suppress the error of the estimated value of the rotation electrical angle of the rotor within 30 degrees.

Figure 4:
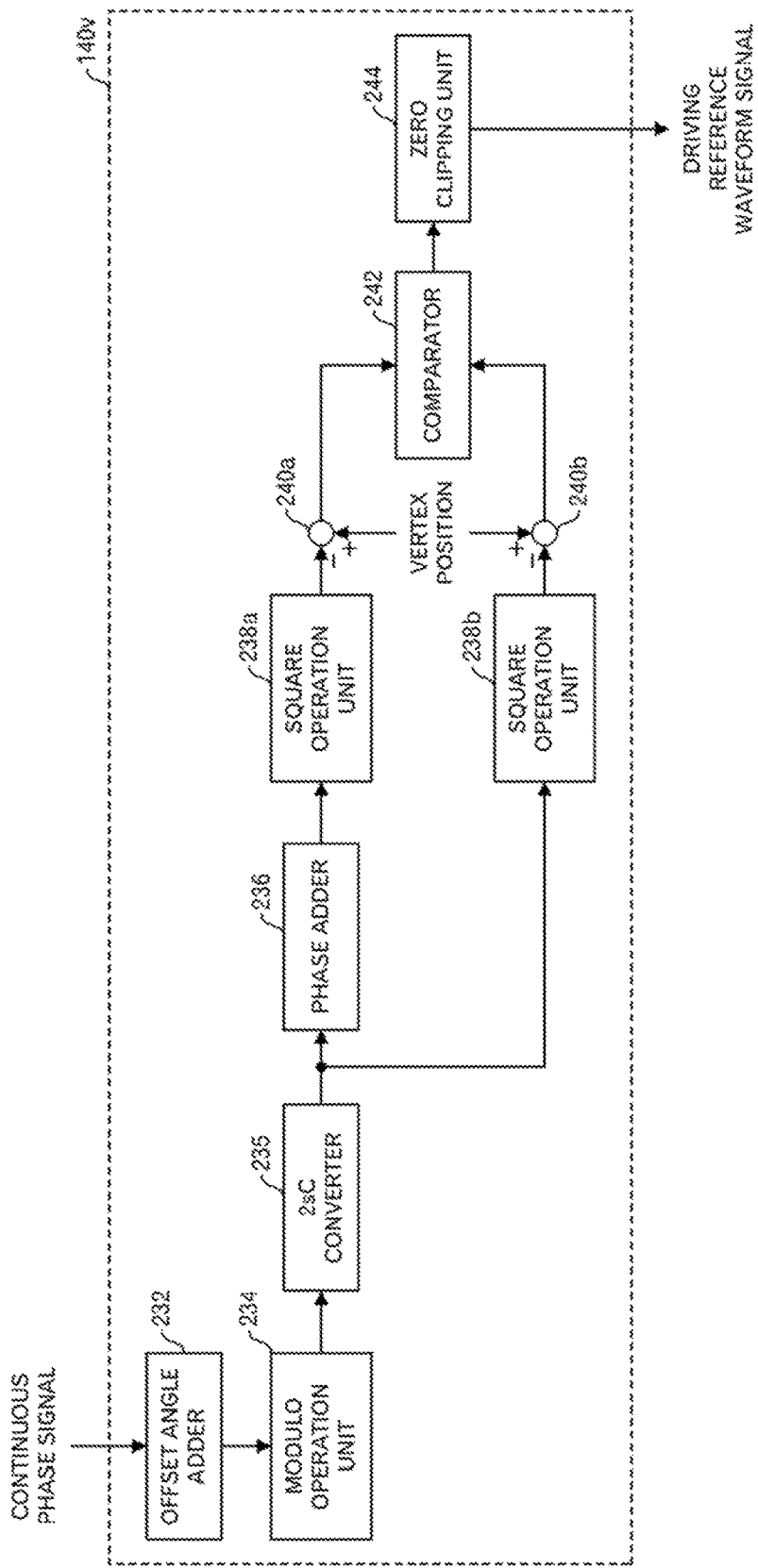
FIG. 4 is a block diagram depicting functions of a V-phase waveform generator relating to one embodiment of this invention.

Next, by referring to FIGS. 4 to 7, the configuration of the waveform generators, which generate the driving reference waveform for each phase will be explained. FIG. 4 is a block diagram depicting functions of the V-phase waveform generator 140v, which generates the V-phase driving reference waveform. Because the driving reference waveforms for each phase other than the V phase is generated similarly to the V-phase driving reference waveform, a method for generating the V-phase driving reference waveform is mainly explained here.

As illustrated in FIG. 4, the V-phase waveform generator 140v relating to one embodiment of this invention has an offset angle adder 232, a modulo operation unit 234, a 2 sC converter 235, an phase adder 236, a square operation unit

238a, a square operation unit 238b, an adder 240a, an adder 240b, a comparator 242 and a zero clipping unit 244.

The offset angle adder 232 adds an offset angle set for each phase to the continuous phase signal from the upper&lower-bits adder 135, which is generated by adding the upper bit phase signal and the interpolated phase signal. For example, the offset angle of 30 degrees is set for the U phase, the offset angle of 150 degrees (the offset angle of the U phase+120 degrees) is set for the V phase, and the offset angle of 270 degrees (the offset angle of the V phase+120 degrees) is set for the W phase.

The modulo operation unit 234 performs a modulo operation for data of the counter upper digits of the continuous phase signal to which the offset angle for each phase is added by the offset angle adder 232 (data derived from the upper bit phase signal from the upper bit phase signal generator 120) to convert the continuous phase signal from the offset angle adder 232 to a signal in a range of the electrical angle from 0 degree to 360 degrees, and outputs the converted signal. As described above, when the value of the upper bit phase signal is from 0 to 5, the modulo operation unit 234 performs an operation of modulo "6", because "6" of the upper bit phase signal means 360 degrees.

The 2 sC converter 235 shifts the continuous phase signal in the range from 0 degree to 360 degrees, which is outputted from the modulo operation unit 234, to a value range from −180 degrees to +180 degrees, which can be represented by complement of 2.

Figure 7:
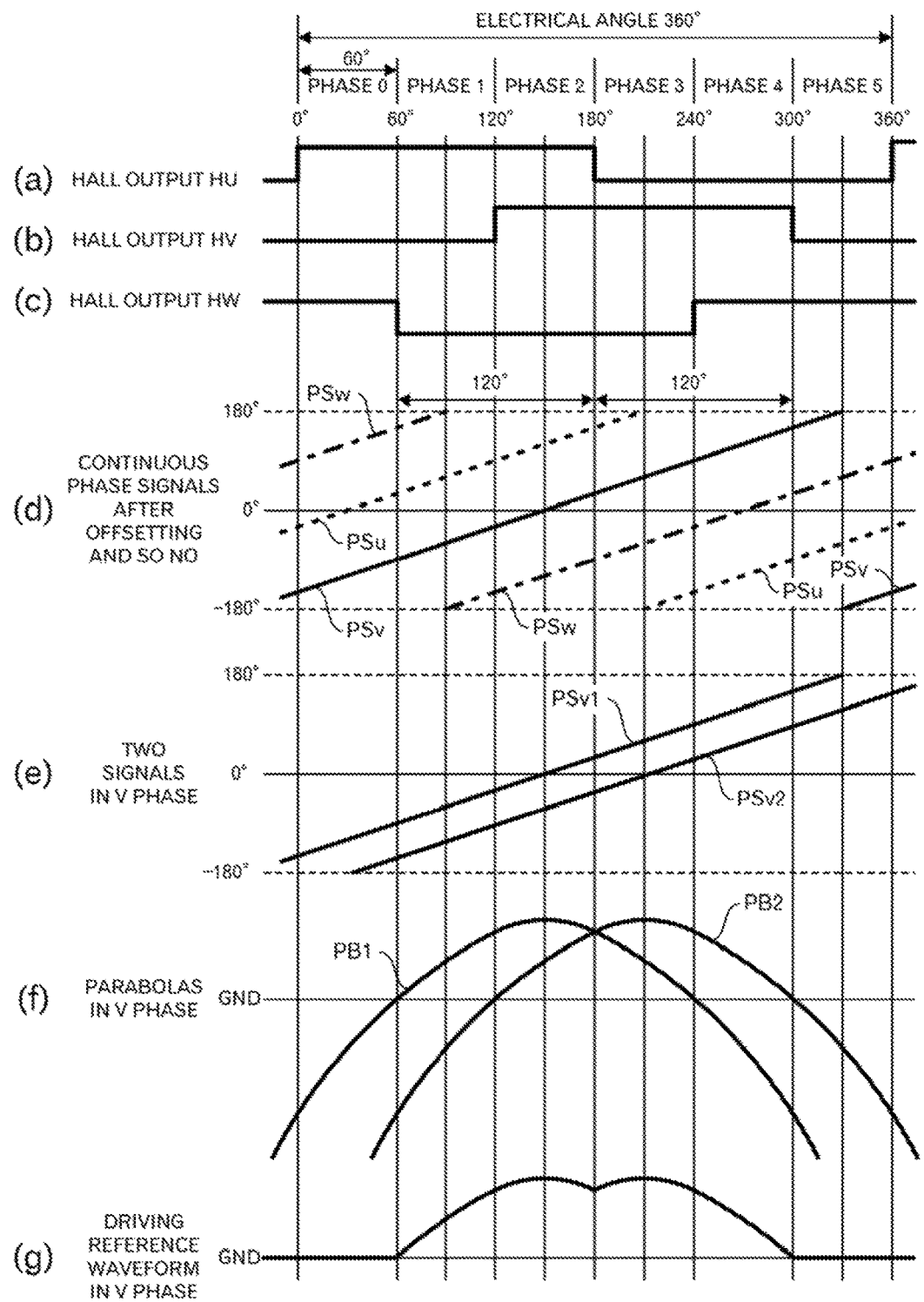
FIG. 7 is a timing chart to explain a process for forming driving waveforms in one embodiment of this invention.

(d) in FIG. 7 depicts the continuous phase signal for each phase, which is generated by adding, in the offset angle adder 232, the offset angle set for each phase to the continuous phase signal depicted in (g) in FIG. 6, converting, in the modulo operation unit 234, the value of the signal after adding the offset angle to a value within a range of the electrical angles from 0 to 360 degrees, and further shifting, in the 2 sC converter 235, the signal to the value range from −180 degrees to +180 degrees. In (d) in FIG. 7, the U-phase continuous phase signal is represented by PSu, the V-phase continuous phase signal is represented by PSv, and the W-phase continuous phase signal is represented by PSw. In an example of (d) in FIG. 7, the offset angle for the U phase is 30 degrees, the offset angle of the V phase is 150 degrees, and the offset angle of the W phase is 270 degrees.

As depicted in (e) in FIG. 7, the phase adder 236 adds an offset angle of −60 degrees to the continuous phase signal PSv1, which is within the range from −180 degrees to +180 degrees and is outputted from the 2 sC converter 235, and again performs the modulo operation for a continuous phase signal PSv2 after this offset to shift the signal to the value range from −180 degrees to +180 degrees.

The square operation unit 238a squares the continuous phase signal PSv2 within the range from −180 degrees to +180 degrees, which is outputted by the phase adder 236, to generate a parabola. Then, by subtracting, in the adder 240a, the parabola generated by the square operation unit 238a from a constant that represents a vertex position, an upwardly convex parabola PB2 is generated as illustrated in (f) in FIG. 7. In addition, the square operation unit 238b generates a parabola by squaring the continuous phase signal PSv1 within the range from −180 degrees to +180 degrees, which is outputted from the modulo operation unit 234, and the adder 240b subtracts the parabola generated by the square operation unit 238b from the constant that represents the aforementioned vertex position to generate an upwardly convex parabola PB1.

The comparator 242 compares a value of the parabola PB1 in each phase and a value of the parabola PB2 in each phase to select and output a greater one. The zero clipping unit 244 clips a negative portion of the output signal from the comparator 242 to generate the driving reference waveform as illustrated in (g) in FIG. 7, as an example.

Figure 8:
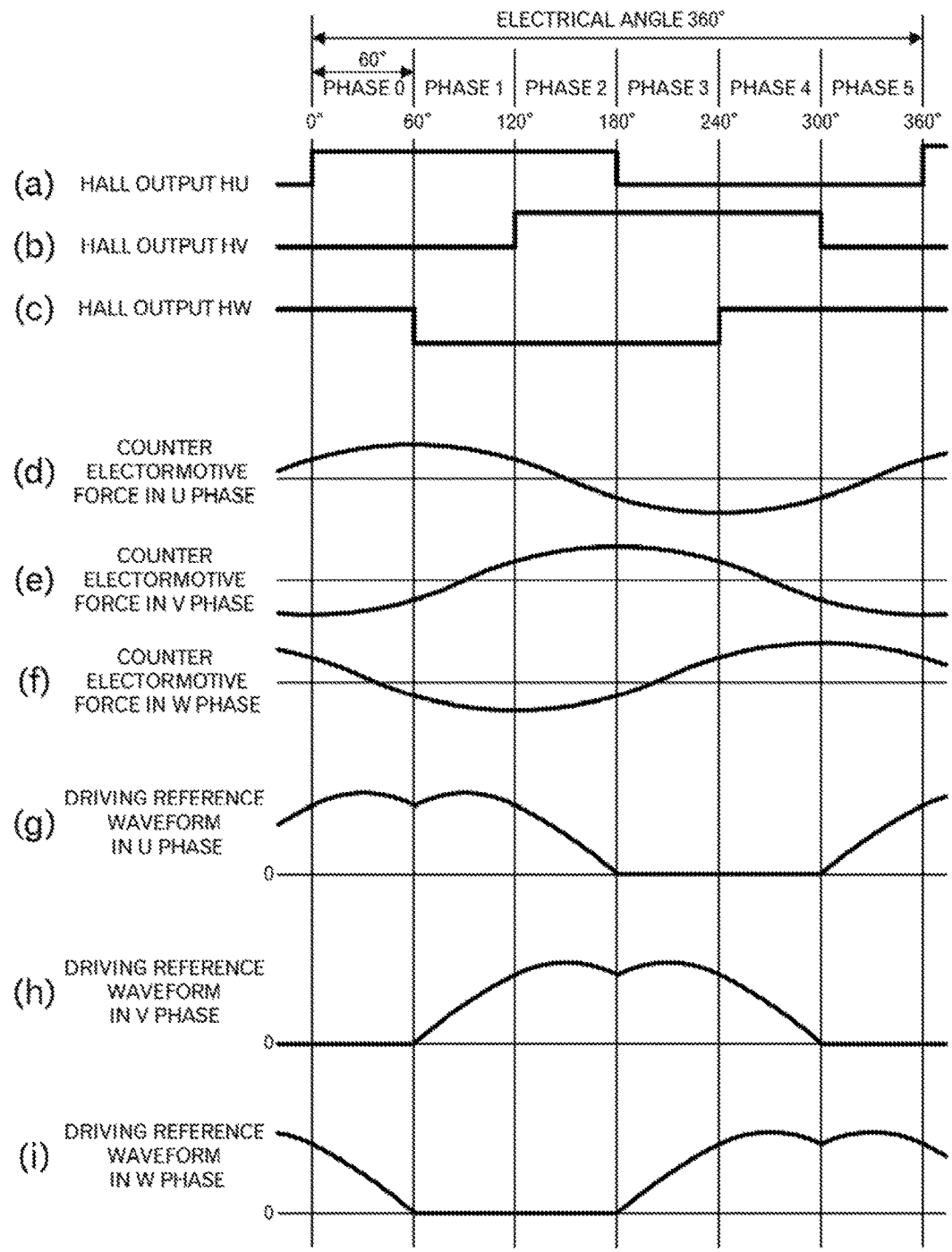
FIG. 8 is a timing chart depicting a relationship between a driving waveform of each phase and counter electromotive force in one embodiment of this invention.

The V-phase driving reference waveform is generated as described above. The U-phase driving reference waveform and W-phase driving reference waveform are also generated similarly to the V-phase driving reference waveform. The U-phase driving reference waveform is shifted by the electrical angle −120 degrees, for example, from the V-phase driving reference waveform, and the W-phase driving reference waveform is shifted by the electrical angle +120 degrees, for example, from the V-phase driving reference waveform. (g) to (i) in FIG. 8 illustrate examples of the driving reference waveform signals for respective phases. As illustrated in the drawing, the driving reference waveform for each phase has a shape, which is almost similar to the counter electromotive force of the corresponding phase, which is illustrated in (d) to (f) in FIG. 8.

By multiplying a predetermined driving voltage code to the driving reference waveform for each phase, which is generated as described above, a PWM code corresponding to a duty ratio of the PWM modulation is generated and the switching elements of the inverter circuit are PWM-driven based on the PWM code. Here, because the driving reference waveform for each phase has a shape similar to the counter electromotive force of the corresponding phase, the motor 105 can be driven with high efficiency. In addition, because there is no discontinuous portion in the driving reference waveform, it is possible to suppress the vibration and noises of the motor 105. Furthermore, in this embodiment, because the driving reference waveform that has a shape similar to the counter electromotive force for each phase can be obtained by a signal processing for the sensor signals from the cheap hall effect ICs without using the expensive current sensor and rotary encoder, it is possible to realize the sine-wave driving with high accuracy without using the expensive components.

Next, by referring to FIGS. 11 and 12, a motor driving control apparatus relating to another embodiment of this invention will be explained. The motor driving control apparatus relating to this embodiment is configured so as to drive the motor 105 by the intermittent turn-on.

Figure 11:
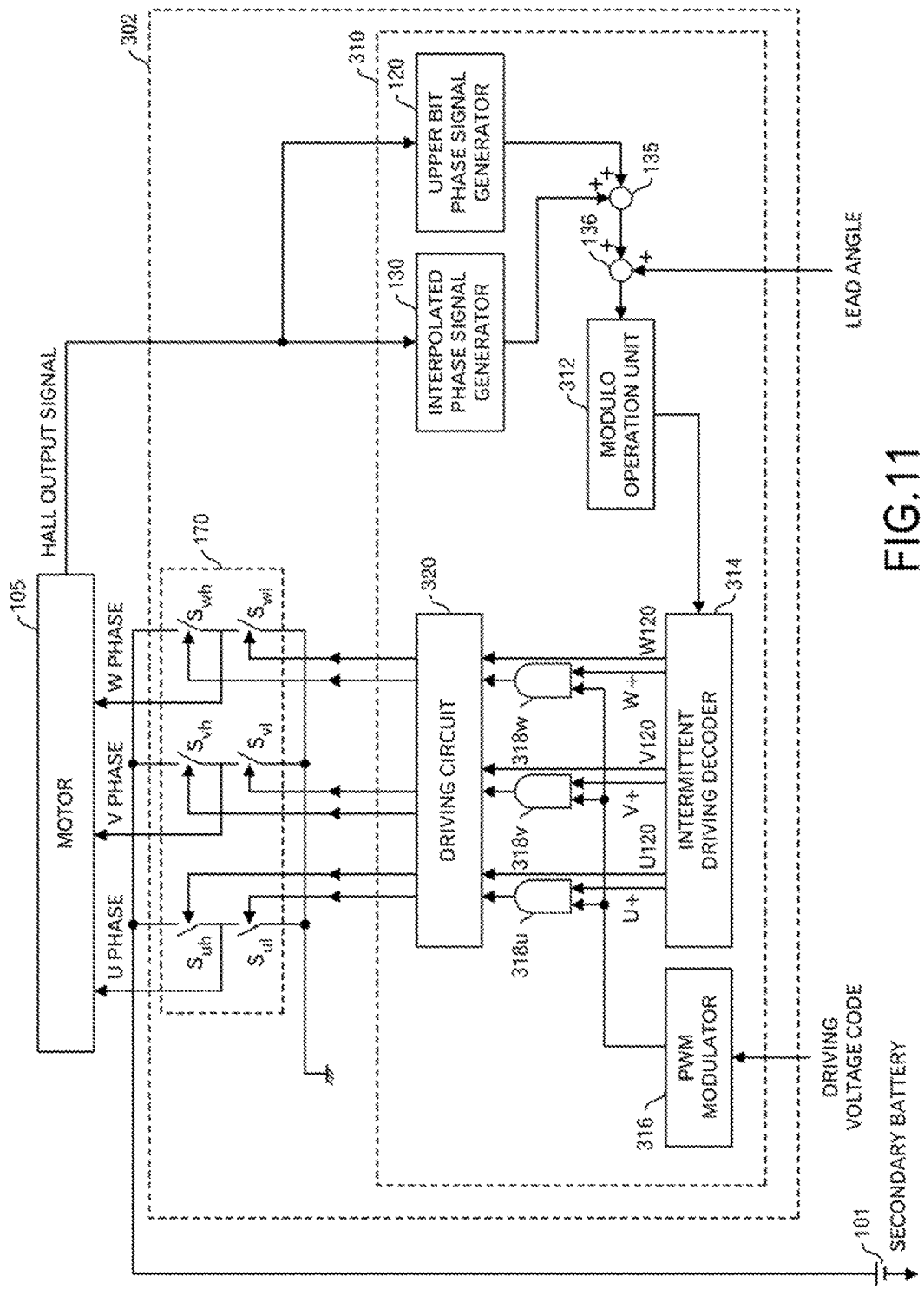
FIG. 11 is a functional block diagram of a motor driving control apparatus relating to another embodiment of this invention.
Figure 12:
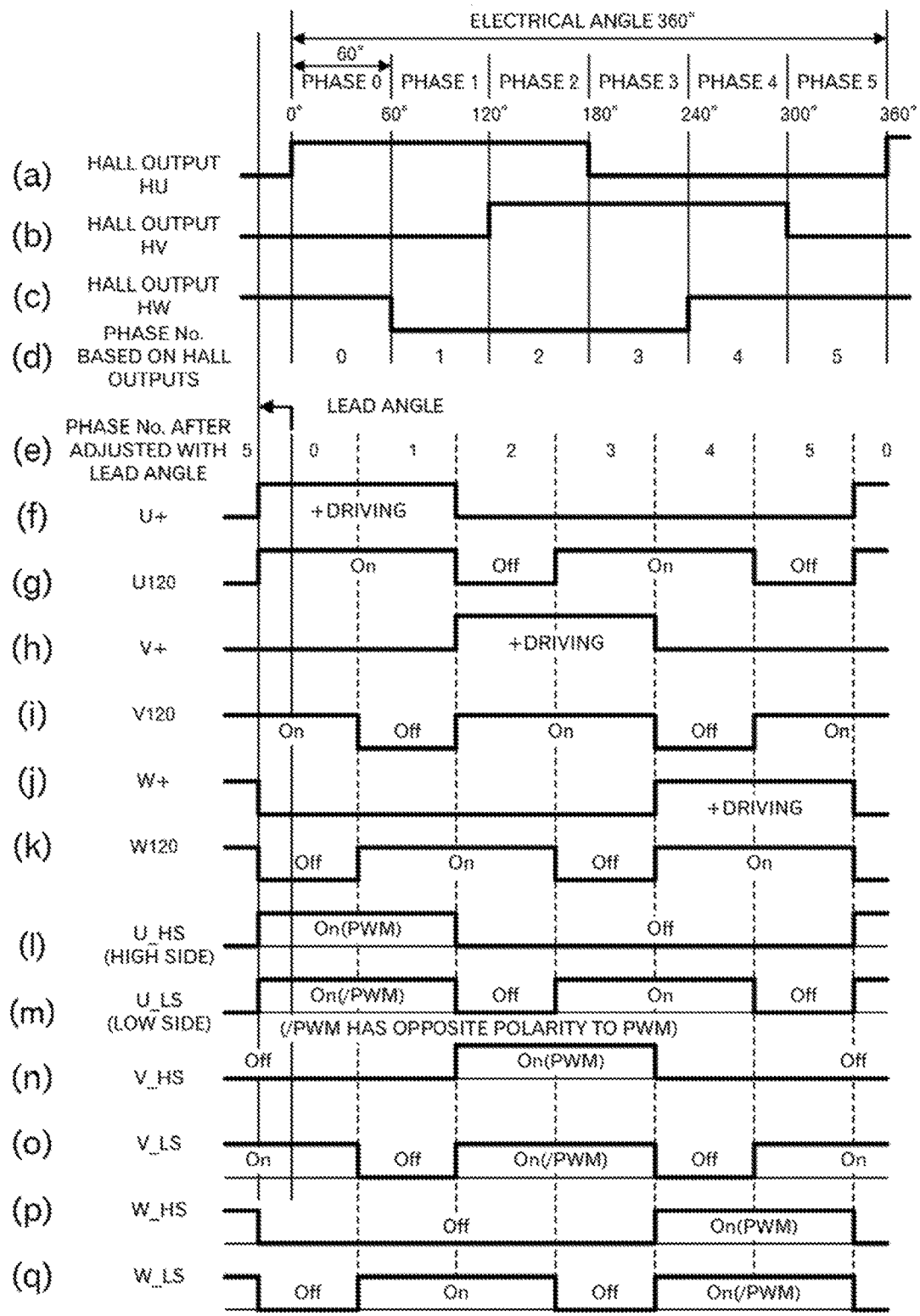
FIG. 12 is a timing chart depicting a phase number, a turn-on command signal for each phase and driving signals in the embodiment in FIG. 11.

FIG. 11 is a functional diagram of the motor driving control apparatus relating to another embodiment of this invention. As for the elements that are substantially the same as those in the motor driving control apparatus in FIG. 2 among elements of the motor driving control apparatus in FIG. 11, the same reference symbols are attached and the explanation for them is omitted. Similarly to the driving controller 110 in FIG. 2, the driving controller 310 of the motor driving control apparatus 302 depicted in FIG. 11 adds the upper bit phase signal and the interpolated phase signal to generate the continuous phase signal corresponding to the rotation electrical angle of the rotor, and further adds the lead angle value to the continuous phase signal to generate a lead-angle-added phase signal.

The driving controller 310 depicted in FIG. 11 has a modulo operation unit 312, an intermittent driving decoder 314, a PWM modulator 316, AND gates 318u, 318v and 318w provided for respective phases and a driving circuit 320.

The modulo operation unit 312 performs an modulo operation for counter upper-digit data of the lead-angle-added phase signal from the lead-angle-value adder 136 to convert the lead-angle-added phase signal to a signal that is within a range from the electrical angle 0 degree to 360 degrees, and outputs the signal.

The intermittent driving decoder 314 encodes the lead-angle-added phase signal, which is converted to the signal that is within the range from the electrical angle 0 degree to 360 degrees, to 3-bit phase number. Because this phase number is calculated by encoding the continuous phase signal to which the lead angle value is added (i.e. the lead-angle-added phase signal), the phase number (refer to (e) in FIG. 12), which is adjusted with the lead angle, is obtained, compared with the phase number (refer to (d) in FIG. 12), which is determined in order of the electrical angle for every 60 degrees, which is represented by the hall output signals Hu, Hv and Hw.

The intermittent driving decoder 314 generates turn-on angle signals to control a turn-on time in the coil for each phase, based on the phase number after adjusted with the lead angle. As illustrated in (f) and (g) in FIG. 12, the turn-on angle signal U+ for the U phase is high in a section of phase numbers "0" and "1" after adjusted with the lead angle, and is low in other sections, and the turn-on angle signal U120 for the U phase is high in a section of phase numbers "0", "1", "3" and "4" after adjusted with the lead angle, and is low in other sections. Moreover, as illustrated in (h) and (i) in FIG. 12, the turn-on angle signal V+ for the V phase is high in a section of phase numbers "2" and "3" after adjusted with the lead angle, and is low in other sections, and the turn-on angle signal V120 for the V phase is high in a section of phase numbers "0", "2", "3" and "5" after adjusted with the lead angle, and is low in other sections. In addition, as illustrated in (j) and (k) in FIG. 12, the turn-on angle signal W+ for the W phase is high in a section of phase numbers "4" and "5" after adjusted with the lead angle, and is low in other sections, and the turn-on angle signal W120 for the W phase is high in a section of phase numbers "1", "2", "4" and "5" after adjusted with the lead angle, and is low in other sections. The turn-on angle signals U+, V+ and W+ are respectively outputted to the corresponding AND gate 318$u$, 318$v$ and 318$w$. Each of the turn-on angle signals U120, V120 and W120 is outputted to the driving circuit 120.

The AND gate 318$u$ generates a logical product of the PWM signal from the PWM modulator 316 and the turn-on angle signal U+, and outputs the generated value to the driving circuit 320. Similarly, the AND gate 318$v$ and AND gate 318$w$ generate a logical product of the PWM signal from the PWM modulator 316 and the corresponding turn-on angle V+ and a logical product of the PWM signal and the corresponding turn-on angle signal W+, and outputs the generated values to the driving circuit 320.

The driving circuit 320 generates switching signals for the U phase based on the output from the AND gate 318$u$ and the turn-on angle signal U120 from the intermittent driving decoder 314, and outputs the generated switching signals to the FET ($S_{uh}$) and FET ($S_{ul}$). Specifically, U_HS depicted in (1) in FIG. 12 is generated as the switching signal for the FET ($S_{uh}$), U_LS depicted in (m) in FIG. 12 is generated as the switching signal for the FET ($S_{ul}$), and the generated switching signals are outputted to the corresponding FET ($S_{uh}$) and FET ($S_{ul}$). In FIG. 12, PWM and "/PWM" represent a period to turn ON/OFF according to the duty ratio corresponding to the PWM code, and because the inverter is a complementary type of inverter, when PWM is ON, /PWM is OFF, and when PWM is OFF, /PWM is ON. In the section of "OFF", the corresponding FET is controlled to be in the high impedance state. The driving circuit 320 generates the switching signals for the V phase and the switching signals for the W phase, similarly to the switching signals for the U phase. V_HS depicted in (n) in FIG. 12 represents the switching signal to be outputted to the FET ($S_{vh}$), and V_LS depicted in (o) in FIG. 12 represents the switching signal to be outputted to the FET ($S_{vl}$). Moreover, W_HS depicted in (p) in FIG. 12 represents the switching signal to be outputted to the FET ($S_{wh}$), and W_LS depicted in (q) in FIG. 12 represents the switching signal to be outputted to the FET ($S_{wl}$).

Thus, according to the motor driving control apparatus relating to this embodiment, the phase number after adjusted with the lead angle value is generated based on the continuous phase signal to which the lead angle value is added, to generate the turn-on angle signal based on that phase number. Then, the switching signals for the driving by the intermittent turn-on are generated based on the turn-on angle signal, and are supplied to the respective FETs of the inverter 170. Accordingly, by using the motor driving control apparatus relating to this embodiment, even when the motor is driven by a driving method by intermittent turn-on, the adjustment by the lead angle can be performed. Therefore, by selecting an appropriate lead angle according to the speed and/or torque, it is possible to quietly drive the motor with high efficiency.

Although the embodiments of this invention were explained, this invention is not limited to those. There are plural specific operation methods to realize the aforementioned functions, and any one of them can be employed. For example, in the aforementioned embodiment, the edge intervals are measured by using the clock that is divided in frequency by the frequency divider 204. However, instead of this embodiment, or in addition to this embodiment (in combination with the aforementioned embodiment), the edge intervals may be measured by using the original reference clock instead of the frequency-divided clock, and the measurement result may be divided by a predetermined number, or the measurement result may be shifted downwardly, by predetermined digits. With such a configuration, it is possible to obtain the same effect. For example, by using the reference clock after shifting downwardly by 8 bits, the same processing as the processing performed when the frequency divider 204 divides the reference clock by 256 can be performed. In addition, instead of the counter that outputs the interpolated phase signal, an accumulator may be used, and a value proportional to the inverse value of the predicted period may be inputted to the accumulator. As a result, the same result can be obtained. Furthermore, at least part of the functions executed in the driving controller 110 may be implemented by dedicated circuits, or each of the aforementioned functions may be implemented by executing, by a computer processor, programs.

Even if the processing and procedure, which were explained in this Specification, are explained to be executed by a single apparatus or program, the processing or procedure may be executed by plural apparatuses or plural programs. The functional blocks explained in this explanation may be integrated into fewer functional blocks, or may be divided into more functional blocks in order to explain them.

In addition to the aforementioned embodiments, a method for generating a signal by the motor control apparatus (102) may be a following method:

A signal generation method includes:

generating an upper bit phase signal by encoding a rotation angle of a rotor according to signal levels of sensor signals;

measuring a period between timings at which the signal levels of the sensor signals change;

predicting a next period based on the period;

generating a lower bit phase signal that changes in a sawtooth wave manner by resetting the lower bit phase signal at timings when the signal levels of the sensor signals change and by changing the lower bit phase signal at speed that is based on the predicted period while the signals levels of the sensor signals do not change, wherein the lower bit phase signal changes for every 1/N of the predicted period, and the N is a predetermined value; and generating a continuous phase signal corresponding to the rotation angle of the rotor by adding the upper bit phase signal and the lower bit phase signal.

In the signal generation method, the generating the lower bit phase signal includes:

dividing, in frequency, a clock that has a predetermined frequency by a division number, which is based on the predicting; and generating the lower bit phase signal by counting results of the dividing.

In the signal generation method, the generating the lower bit phase signal includes:

generating a value that is proportional to an inverse value of the predicted period; and generating the lower bit phase signal by accumulating the value that is proportional to the inverse value.

In the signal generation method, the generating the lower bit phase signal includes stopping an increase of the lower bit phase signal to saturate the lower bit phase signal at a full range output value.

In the signal generation method, the generating the lower bit phase signal includes stopping an increase of the lower bit phase signal to saturate the lower bit phase signal at an output value of almost a half of the full range when the brushless motor is in a low rotation state.

In the signal generation method, the predicting includes determining the low rotation state if the period between the timings when the signal levels of the sensor signal change is full-count.

In the signal generation method, the predicting includes outputting a period between the timings when the signal levels of the sensor signals change as the predicted period.

In the signal generation method, the predicting includes outputting the predicted period, which is predicted based on a period between the timings when the signal levels of the sensor signals change and a past period between the timings when the signal levels of the sensor signals change.

Furthermore, a motor driving control apparatus relating to one embodiment of this invention is a motor driving control apparatus for driving a brushless motor by using sensor signals outputted for every predetermined rotation electrical angles of a rotor from plural hall effect ICs provided for respective corresponding coils of respective phases. This motor driving control apparatus includes: an upper bit phase signal generator configured to generate an upper bit phase signal by encoding a rotation electrical angle of the rotor according to signal levels of the sensor signals; a hall edge pulse generator configured to generate hall edge pulses at timings when the signal levels of the sensor signals change; a frequency divider configured to generate a divided clock signal by dividing, in frequency, a reference clock signal by a predetermined frequency division ratio; a first counter configured to measure a time interval between a present hall edge pulse and a last hall edge pulse by counting the reference clock signal by using, as an enable signal, the divided reference clock signal and by clearing a count value in response to the present hall edge pulse outputted from the hall edge pulse generator; a prediction unit configured to determine a predicted value of a time interval from the present hall edge pulse to a next hall edge pulse based on the time interval measured by the first counter; a second counter configured to downwardly count the reference clock signal from the predicted value, and to output a borrow signal in response to an underflow; a third counter configured to output, as an interpolated phase signal, a count value obtained by counting the reference clock signal by using, as an enable signal, the borrow signal from the second counter; an adder configured to add the upper bit phase signal and the interpolated phase signal to generate a continuous phase signal corresponding to the rotation electrical angle of the rotor; and an inverter circuit configured to supply a driving voltage to a coil of each phase, based on a driving signal, which is generated based on the continuous phase signal. The hall effect IC can detect changes of a magnetic flux by using the hall effect. Furthermore, it is possible to detect the magnetic flux by using the hall effect, also by using various components such as a hall device.

Moreover, a motor driving control apparatus relating to another embodiment of this invention is a motor driving control apparatus for driving a brushless motor by using sensor signals outputted for every predetermined rotation electrical angles of a rotor from plural hall effect ICs, which are provided for respective coils of respective phases. This motor driving control apparatus includes: an upper bit phase signal generator configured to generate an upper bit phase signal by encoding a rotation electrical angle of the rotor according to signal levels of the sensor signals; a hall edge pulse generator configured to generate hall edge pulses at timings when a signal level of the sensor signals changes; a frequency divider configured to generate a divided clock signal by dividing, in frequency, a reference clock signal by a predetermined frequency division ratio; a first counter configured to measure a time interval between a present hall edge pulse and a last hall edge pulse by counting the reference clock signal by using, as an enable signal, the divided clock signal, and by clearing a count value in response to the present hall edge pulse outputted from the hall edge pulse generator; a prediction unit configured to determine a predicted value of a time interval from the present hall edge pulse to a next hall edge pulse based on the time interval measured by the first counter; a second counter configured to count the reference clock signal from the predicted value downwardly, and output a borrow signal in response to an underflow; a third counter configured to output, as an interpolated phase signal, a count value obtained by counting the reference clock signal by using, as an enable signal, the borrow signal from the second counter; an upper and lower bits adder configured to generate a continuous phase signal corresponding to the rotation electrical angle of the rotor by adding the upper bit phase signal and the interpolated phase signal; a lead-angle value adder configured to generate a lead-angle-added phase signal by adding a lead angle value to the continuous phase signal; a turn-on angle signal generator configured to generate a turn-on angle signal representing a turn-on timing of the coil of every phase based on the lead-angle-added phase signal; and an inverter circuit configured to supply a driving voltage to a coil of each phase based on a driving signal generated based on the turn-on angle signal, which is generated by the turn-on angle signal generator.

What is claimed is:

1. A motor driving control apparatus, comprising:
a first signal generator configured to generate a first signal representing which rotation angle section of a plurality of rotation angle sections a present rotation angle section is, according to a sensor signal that changes every predetermined rotation angle of a rotor for a motor, wherein each of the plurality of rotation angle sections has the predetermined rotation angle;

a measurement unit configured to measure a period of each of the plurality of rotation angle sections according to the sensor signal;

a prediction unit configured to predict a period of a next rotation section based on one or plural rotation angle sections measured by the measurement unit;

a second signal generator configured to generate a second signal representing a relative rotation angle of the rotor in the next rotation angle section for each period that is obtained by dividing the predicted period by a predetermined number; and a third signal generator configured to generate a third signal that represents a rotation angle of the rotor, which is a sum of a rotation angle corresponding to a rotation angle section represented by the first signal and the relative rotation angle represented by the second signal, to control generation of at least one driving voltage to be supplied to the motor.

2. The motor driving control apparatus as set forth in claim 1, wherein the second signal generator is further configured to maintain a second signal representing a first predetermined angle, when the relative rotation angle of the rotor in the next rotation angle section reaches the first predetermined rotation angle.

3. The motor driving control apparatus as set forth in claim 1, wherein the second signal generator is further configured to generate a value that is proportional to a reciprocal of the predicted period, and generate the second signal by accumulating the generated value.

4. The motor driving control apparatus as set forth in claim 1, wherein the second signal generator is further configured to maintain a second signal representing a preset angle, when the rotor is in a predetermined low-speed rotation speed.

5. The motor driving control apparatus as set forth in claim 4, wherein the measurement unit comprises a counter, and when a count value of the counter becomes a full-count value, the predetermined low-speed rotation state is determined.

6. The motor driving control apparatus as set forth in claim 1, wherein the prediction unit is configured to predict the period of the next rotation angle section based on a period of a latest rotation angle section of the plural rotation angle sections measured by the measurement unit and a period of a rotation angle section before the latest rotation angle section.

7. The motor driving control apparatus as set forth in claim 1, further comprising:

an inverter circuit configured to supply a driving voltage to a brushless motor that has the rotor, based on a driving signal generated based on the third signal.

8. The motor driving control apparatus as set forth in claim 1, wherein the motor is a brushless motor that has the rotor, and the apparatus further comprises:

an adder configured to generate a fourth signal by adding a lead angle to the third signal;

a turn-on angle signal generator configured to generate, based on the fourth signal, a turn-on angle signal representing a turn-on timing for a plurality of coils included in the brushless motor; and an inverter circuit configured to control, based on the turn-on signal, a driving voltage supply state for the plurality of coils and a high-impedance state of the plurality of coils.

9. A motor-assisted vehicle, comprising:

a motor; and a motor driving control apparatus, comprising:

a first signal generator configured to generate a first signal representing which rotation angle section of a plurality of rotation angle sections a present rotation angle section is, according to a sensor signal that changes every predetermined rotation angle of a rotor of the motor, wherein each of the plurality of rotation angle sections has the predetermined rotation angle;

a measurement unit configured to measure a period of each of the plurality of rotation angle sections according to the sensor signal;

a prediction unit configured to predict a period of a next rotation section based on one or plural rotation angle sections measured by the measurement unit;

a second signal generator configured to generate a second signal representing a relative rotation angle of the rotor in the next rotation angle section for each period that is obtained by dividing the predicted period by a predetermined number; and a third signal generator configured to generate a third signal that represents a rotation angle of the rotor, which is a sum of a rotation angle corresponding to a rotation angle section represented by the first signal and the relative rotation angle represented by the second signal, to control generation of at least one driving voltage to be supplied to the motor.

* * * * *